(12) United States Patent
Watanabe et al.

(10) Patent No.: US 9,030,210 B2
(45) Date of Patent: May 12, 2015

(54) INSULATION DETERIORATION DIAGNOSIS APPARATUS

(75) Inventors: Yoshimasa Watanabe, Tokyo (JP); Yoshiharu Kaneda, Tokyo (JP); Hiroshi Nishizawa, Tokyo (JP); Toru Oka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 219 days.

(21) Appl. No.: 13/582,758
(22) PCT Filed: Apr. 4, 2011
(86) PCT No.: PCT/JP2011/058531
§ 371 (c)(1),
(2), (4) Date: Sep. 5, 2012
(87) PCT Pub. No.: WO2011/129218
PCT Pub. Date: Oct. 20, 2011

(65) Prior Publication Data
US 2012/0319699 A1 Dec. 20, 2012

(30) Foreign Application Priority Data
Apr. 14, 2010 (JP) ................................. 2010-092714

(51) Int. Cl.
*H01H 31/12* (2006.01)
*G01R 31/02* (2006.01)
(Continued)

(52) U.S. Cl.
CPC .............. *G01R 31/025* (2013.01); *G01R 31/14* (2013.01); *G01R 31/34* (2013.01); *G01R 31/40* (2013.01)

(58) Field of Classification Search
CPC .. G01R 31/1227; G01R 31/025; G01R 31/14; G01R 31/40; G01R 31/06; G01R 31/088; G01R 31/1236; G01R 31/2829; G01R 31/34; B60L 3/0069; H01J 37/285; H01H 2011/0068; H01H 83/144
USPC ......... 324/551, 451, 457, 458, 510, 536, 547, 324/613, 765.01, 76.12, 522, 541, 555, 544, 324/557, 713; 361/1, 23, 30, 31, 33, 42; 318/701, 720; 702/64
See application file for complete search history.

(56) References Cited

U.S. PATENT DOCUMENTS 4,534,206 A * 8/1985 Kiso et al. .................... 73/12.09
4,929,903 A 5/1990 Saigo et al.
(Continued)

FOREIGN PATENT DOCUMENTS

CN 1067317 A 12/1992
CN 1680821 A 10/2005
(Continued)

OTHER PUBLICATIONS

Combined Chinese Office Action and Search Report issued Mar. 12, 2014 in Patent Application No. 201180014852.0 with Partial English Translation and English Translation of Category of Cited Documents.

(Continued)

*Primary Examiner* — Huy Q Phan
*Assistant Examiner* — Raul Rios Russo
(74) *Attorney, Agent, or Firm* — Oblon, McClelland, Maier & Neustadt, L.L.P.

(57) ABSTRACT

The invention is related to an insulation deterioration diagnostic apparatus for an electric path connected between an inverter device and an inverter-driven load device, including: a zero-phase current transformer having an annular magnetic core, a magnetizing coil wound around the magnetic core, and a detecting coil wound around the magnetic core, the transformer being for detecting a zero-phase current of an electric path; a magnetization control circuit for supplying an alternating current having a frequency at least twice as high as a drive frequency of the load device to the magnetizing coil to magnetize the magnetic core; and a frequency extracting circuit for extracting a frequency component identical to the drive frequency fd, from the output signal of the detecting coil, whereby precisely measuring a current leaking from an inverter-driven load device over a wide range of frequencies.

5 Claims, 11 Drawing Sheets

(51) Int. Cl.
*G01R 31/14* (2006.01)
*H01H 31/02* (2006.01)
*G01R 31/34* (2006.01)
*G01R 31/40* (2014.01)

(56) References Cited

U.S. PATENT DOCUMENTS

| | | | | |
|---|---|---|---|---|
| 5,223,789 | A * | 6/1993 | Katsuyama et al. | 324/127 |
| 5,446,383 | A * | 8/1995 | Pearse et al. | 324/240 |
| 7,061,370 | B2 * | 6/2006 | Cern | 375/258 |
| 7,696,743 | B2 * | 4/2010 | Tajima et al. | 324/127 |
| 2005/0036250 | A1 | 2/2005 | Asano | |
| 2005/0225909 | A1 | 10/2005 | Yoshizaki et al. | |
| 2007/0211524 | A1 * | 9/2007 | Kurisu | 365/158 |
| 2008/0165462 | A1 | 7/2008 | Atoji et al. | |
| 2009/0289618 | A1 * | 11/2009 | Tajima et al. | 324/127 |
| 2010/0213905 | A1 | 8/2010 | Doumae et al. | |

FOREIGN PATENT DOCUMENTS

| | | |
|---|---|---|
| JP | 63 85380 | 4/1988 |
| JP | 4 40372 | 2/1992 |
| JP | 4 132969 | 5/1992 |
| JP | 7 146348 | 6/1995 |
| JP | 7 239359 | 9/1995 |
| JP | 2001 124814 | 5/2001 |
| JP | 2003-219552 | 7/2003 |
| JP | 2003 284235 | 10/2003 |
| JP | 2003-315374 A | 11/2003 |
| JP | 2005 57965 | 3/2005 |
| JP | 2007 159289 | 6/2007 |
| JP | 2009-112108 | 5/2009 |
| TW | 200702673 | 1/2007 |

OTHER PUBLICATIONS

International Search Report Issued Jul. 12, 2011 in PCT/JP11/58531 Filed Apr. 4, 2011.
Taiwanese Office Action issued Jul. 23, 2013, in Taiwan Patent Application No. 100112613 (with English translation).
English Translation of the International Preliminary Report on Patentability issued Nov. 15, 2012, in PCT/JP2011/058531.
English Translation of the Written Opinion of the International Searching Authority issued Jul. 12, 2011, in PCT/JP2011/058531.
Office Action issued Sep. 26, 2013 in Korean Patent Application No. 10-2012-7026710 (with partial English language translation).

* cited by examiner

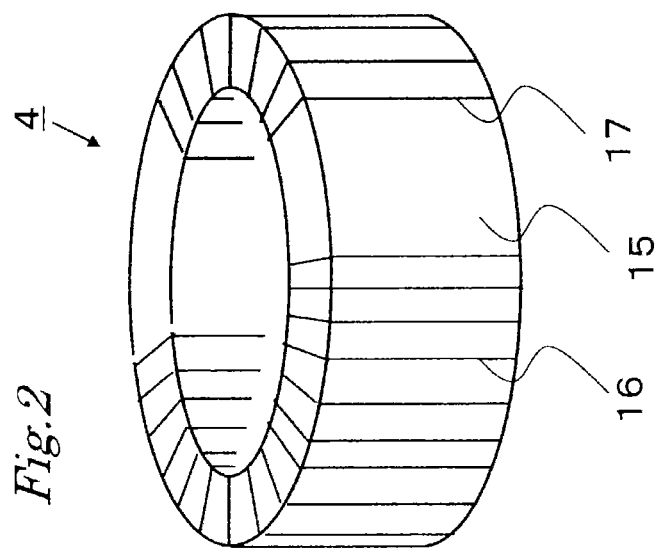

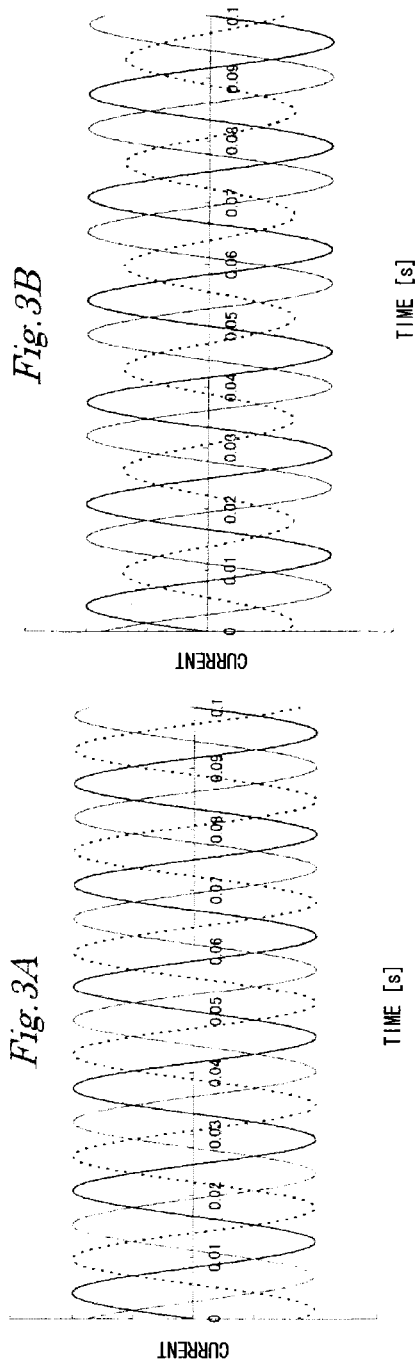
*Fig. 3A*
*Fig. 3B*
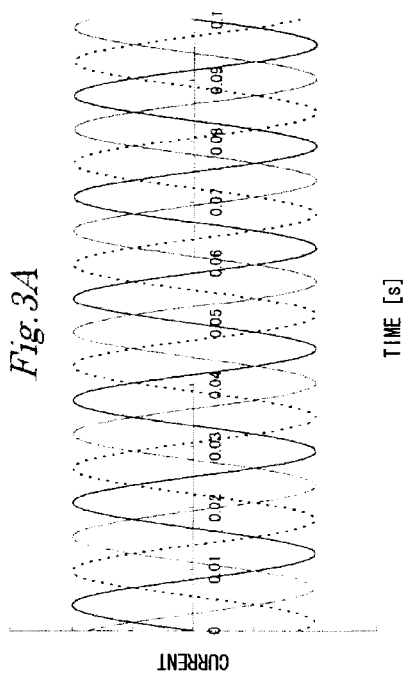
*Fig. 3C*
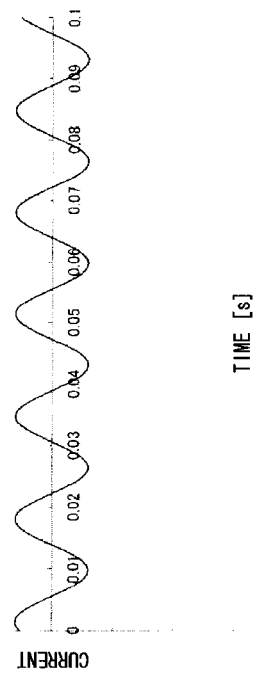

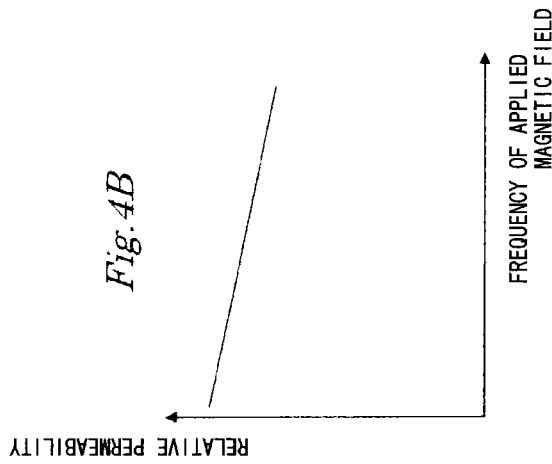
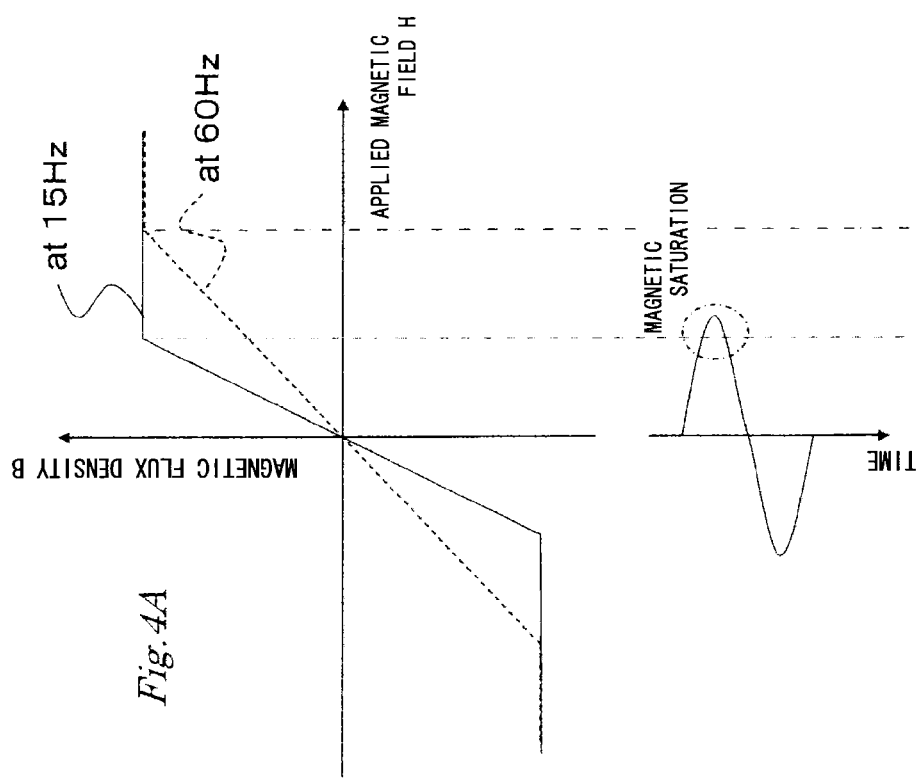

US 9,030,210 B2

INSULATION DETERIORATION DIAGNOSIS APPARATUS

TECHNICAL FIELD

The present invention relates to an insulation deterioration diagnostic apparatus that detects a current leaking from an electric path connected between an inverter device and an inverter-driven load device, in order to carry out an insulation deterioration diagnosis.

BACKGROUND

Exemplary inverter-driven load devices may include an electric motor, an uninterruptible power supply (UPS), an electromagnetic cooker, illumination and the like. All of these devices may suffer from insulation deterioration due to aging deterioration. For example, in case of an electric motor used for a transport machine, movement of a platform coupled to the motor may cause friction, twist or extension and contraction in a power feeding conductor cable, resulting in a damaged conductor film. In another case of an electric motor used for a cutting machine, a cutting fluid, oil or the like may be scattered onto the motor, and then run through a shaft thereof to encroach insulating materials inside the motor.

Thus, a degree of insulation deterioration of the inverter-driven load device can be varied depending on an environment in use or durability of members. Once a leakage current flows through a portion where this insulation deterioration occurs, causing a risk of electrifying human bodies or working an earth leakage breaker. The earth leakage breaker is installed for preventing the electrification of the human body. As a matter of course, the first priority is given to human life. However, once the earth leakage breaker is operated, apparatuses or facilities including the load device of interest are forced to be stopped. Thus, it will take a lot of time to identify how and where the electric leakage has been caused as well as to restore the apparatuses or facilities, thereby lowering the operation efficiency thereof.

Exemplary means for measuring such a leakage current is disclosed in FIG. 2 of Patent Document 1, FIG. 1 of Patent Document 2, and FIG. 1 of Patent Document 3. On the feeding electric path to the inverter-driven load device, a zero-phase current transformer (ZCT) that measures the differential current component between the to and fro paths and the zero-phase current of the three-phase alternating current is arranged, or a current detector such as a current transformer (CT), a Hall CT, a shunt resistor or the like is arranged for each phase. Then, the leakage current is calculated by summing the output signals of all the phases.

In recent years, for example, as shown in FIG. 1 of Patent Document 4, proposed is an insulation deterioration diagnostic apparatus for detecting insulation deterioration in the following manner: a power supply circuit to an electric motor is switched using a switch to a closed circuit including an insulation resistance and the ground; an AC (alternating current) voltage applied to the control circuit of the electric motor is rectified by a rectifier circuit; and the obtained DC (direct current) voltage is used to measure a current flowing into the closed circuit. In this case, since the leakage current is a DC component, the zero-phase current transformer or the current transformer designed to detect an AC component cannot be used. Accordingly, any element that can detect a DC component, such as the Hall CT or the shunt resistor, is used.

PRIOR ART DOCUMENT

Patent Document

[PATENT DOCUMENT 1] JP 2003-284235 A (FIG. 2)
[PATENT DOCUMENT 2] JP 4-132969 A (1992) (FIG. 1)
[PATENT DOCUMENT 3] JP 2001-124814 A (FIG. 1)
[PATENT DOCUMENT 4] JP 2007-159289 A (FIG. 1)
[PATENT DOCUMENT 5] JP 7-239359 A (1995) (FIG. 3)
[PATENT DOCUMENT 6] JP 63-85380 A (1988) (FIG. 1)

DISCLOSURE OF THE INVENTION

Problem to be Solved by the Invention

Since a trigger and a progressing degree of insulation deterioration can be varied depending on the usage environment, the insulation deterioration diagnosis must be regularly carried out. However, as disclosed in Patent Document 4, though the insulation deterioration diagnostic apparatus that carries out the insulation deterioration diagnosis by switching to the insulation deterioration diagnosis-purpose power supply circuit through use of a switch or the like can carry out precise insulation deterioration diagnosis, the power supply to the inverter-driven load device must be completely stopped. Therefore, for the load device that must operate continuously for a long term, the insulation deterioration diagnosis cannot be carried out until the power supply is completely stopped. This poses a problem that the insulation deterioration cannot be preliminarily detected.

From the above-mentioned viewpoint, the zero-phase current transformer that is also used for the ground fault interrupter, an earth leakage relay or the like is suitable for constant measurement. However, the leakage current that can be measured using the zero-phase current transformer is 1 mA or more in case of a highly precise type, or several mA or more in case of a general-purpose type. Therefore, there is a problem that the insulation deterioration of the load device cannot be detected until it has significantly progressed.

Similarly, a CT employing a thin film magnetism detecting element, such as Hall element or magnetoresistive element, or the shunt resistor can also measure an alternating current, therefore, which can effectively measure a current while a load device is driven. However, for the reasons such as: 1) an output of the thin film magnetism detecting element fluctuates depending on variations in ambient temperature; and 2) since the shunt resistor has a small resistance value, the output voltage in response to a minute electric current is small, variations in resistance value and influence of ambient temperature may significantly influence accuracy of measurement, they are not suitable for measuring a minute electric current.

Since the zero-phase current transformer that is suitable for constant measurement can sensitively collect the zero-phase magnetic field generated from the zero-phase current, a magnetic material of high permeability is used as a component part thereof, i.e., PC permalloy is commonly used. However, PC permalloy has a frequency characteristic that the magnetic characteristic varies depending on the frequency of the applied magnetic field, resulting in a characteristic that the permeability is reduced as the frequency increases.

The inverter-driven load device can efficiently control the driving operation thereof by controlling the frequency of the voltage or current being supplied. For example, the drive speed of the inverter-driven electric motor can generally be controlled by controlling the drive voltage frequency. Therefore, the drive speed and the drive voltage frequency are in a proportional relationship.

Further, an inverter is employed for modulating the drive voltage frequency, and a V/f constant control is adopted, which is exerted such that a ratio of the drive voltage to the drive voltage frequency applied to each phase of the electric motor is kept constant. When the drive voltage frequency is lowered, the drive voltage applied to each phase of the electric motor is also lowered, whereas when the drive voltage frequency is raised, the drive voltage applied to each phase of the electric motor is also raised. That is, in case of the electric motor rotating at low speeds, even when one tries to measure the current leaking from the electric path, a minute electric current is leaked from an insulation-deteriorated portion because the drive voltage applied to each phase of the electric motor is low.

Thus, when measuring a current leaked from an inverter-driven load device using a zero-phase current transformer, the zero-phase current to be measured is still a minute electric current depending on the drive voltage value or the drive voltage frequency supplied to the load device. Further, under the influence of the frequency characteristic of PC permalloy, there is a problem that precise measurement cannot be carried out.

It is an object of the present invention to provide an insulation deterioration diagnostic apparatus that can precisely measure a current leaking from an inverter-driven load device over a wide range of frequencies.

Means for Solving the Problem

In order to achieve the above object, according to a first aspect of the present invention, there is provided an insulation deterioration diagnostic apparatus for an electric path connected between an inverter device and an inverter-driven load device, including:
a zero-phase current transformer having an annular magnetic core, a magnetizing coil wound around the magnetic core, and a detecting coil wound around the magnetic core, the transformer being for detecting a zero-phase current of an electric path;
a magnetization control circuit for supplying an alternating current having a frequency at least twice as high as a drive frequency of the load device to the magnetizing coil to magnetize the magnetic core; and
a frequency extracting circuit for extracting a predetermined frequency component from an output signal of the detecting coil.

It is preferable in the first aspect of the present invention that the apparatus further includes a detector for detecting one of a current waveform and a voltage waveform supplied to the load device, wherein the current supplied to the magnetizing coil is controlled based on an output signal of the detector.

It is preferable in the first aspect of the present invention that the apparatus further includes a frequency calculating circuit for calculating the drive frequency based on the output signal of the detector, wherein the frequency extracting circuit extracts a frequency component identical to the drive frequency, from the output signal of the detecting coil.

It is preferable in the first aspect of the present invention that the frequency extracting circuit extracts a second harmonic component of the magnetizing frequency of the magnetic core.

It is preferable in the first aspect of the present invention that the apparatus further includes an operation determination circuit for determining whether or not the magnetization control circuit is to be operated, based on a calculation result of the frequency calculating circuit.

It is preferable in the first aspect of the present invention that the apparatus further includes a diagnosis determination circuit for determining whether or not the insulation deterioration diagnosis is to be carried out, based on the calculation result of the frequency calculating circuit.

According to a second aspect of the present invention, there is provided an insulation deterioration diagnostic apparatus for an electric path connected between an inverter device and an inverter-driven load device, including:
a plurality of zero-phase current transformers, each having a magnetism saturation level different with respect to one another, for detecting a zero-phase current of an electric path;
a detector for detecting one of a current waveform and a voltage waveform supplied to the load device;
a frequency calculating circuit for calculating a drive frequency of the load device based on an output signal of the detector; and
a conversion determination circuit for determining whose output signal is to be used out of the plurality of zero-phase current transformers in carrying out the insulation deterioration diagnosis, based on a calculation result of the frequency calculating circuit.

According to a third aspect of the present invention, there is provided an insulation deterioration diagnostic apparatus for an electric path connected between an inverter device and an inverter-driven load device, including:
a zero-phase current transformer for detecting a zero-phase current of an electric path;
a detector for detecting one of a current waveform and a voltage waveform supplied to the load device;
a frequency calculating circuit for calculating a drive frequency of the load device based on an output signal of the detector; and
sensitivity adjusting means for adjusting sensitivity of the zero-phase current transformer, based on a calculation result of the frequency calculating circuit.

It is preferable in the third aspect of the present invention that the magnetism saturation changing means adjusts the sensitivity of the zero-phase current transformer by changing one of a temperature of a magnetic core included in the zero-phase current transformer and a stress applied to the magnetic core.

Effect of the Invention

According to the present invention, even in case where the drive frequency of the load device varies, the dependency of the drive frequency can be reduced by changing the sensitivity or the magnetism saturation level of the employed zero-phase current transformer, thereby precisely measuring the zero-phase current. As a result, a reliable insulation deterioration diagnosis can be carried out.

BRIEF DESCRIPTION OF THE DRAWINGS

FIG. 2 is a perspective view showing one example of a zero-phase current transformer.

FIG. 3A to 3C are each an explanatory diagram showing a state where a zero-phase current occurs.

FIGS. 4A and 4B are each an explanatory diagram schematically showing a frequency characteristic of PC permalloy; FIG. 4A shows frequency variation of B-H curve and FIG. 4B shows frequency variation of relative permeability.

FIG. 6A shows B-H curve of a magnetic core and a waveform of a magnetizing field, FIG. 6B shows a state where a magnetic core is magnetically saturated, and FIG. 6C shows a state where a DC magnetic field is superimposed.

EMBODIMENT FOR CARRYING OUT THE INVENTION (Embodiment 1)

Figure 1:
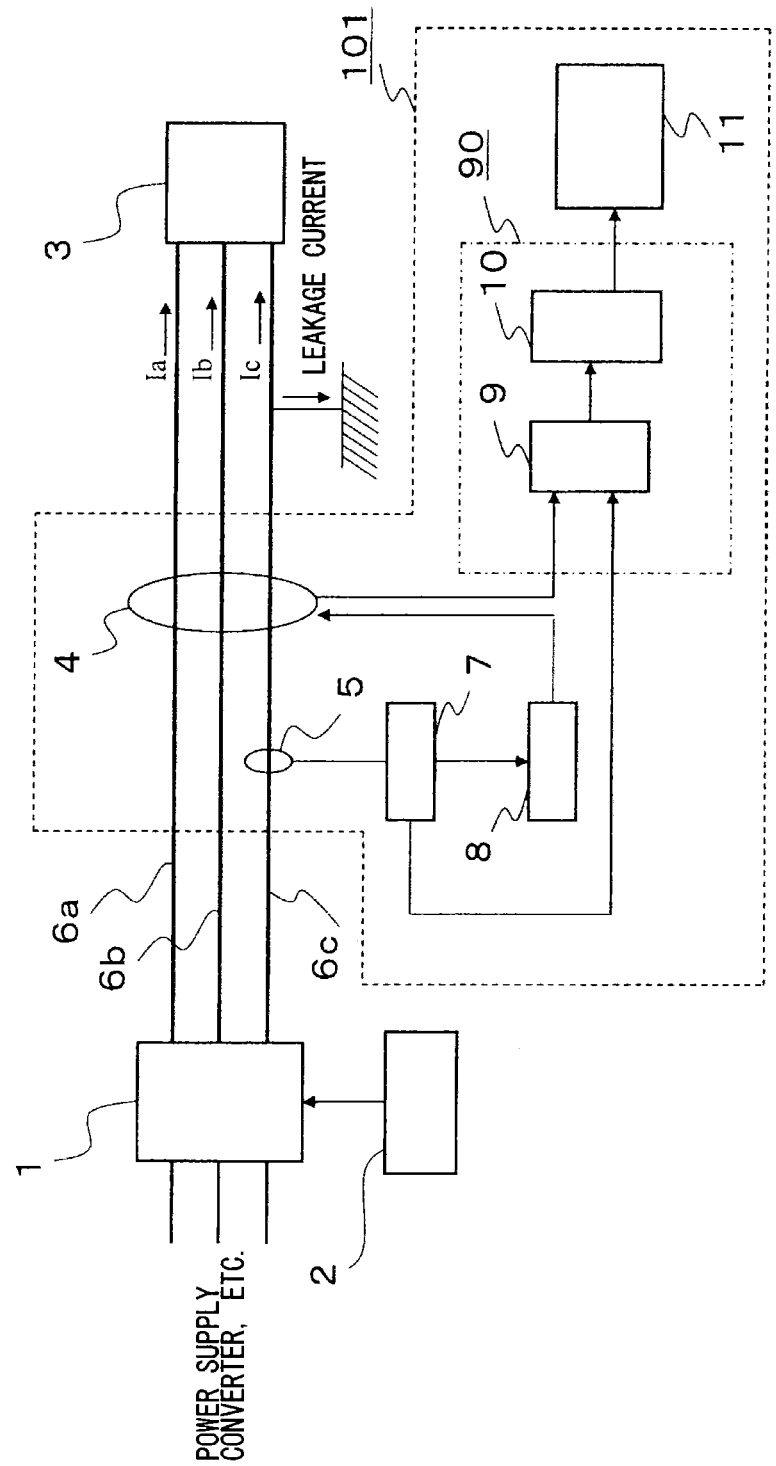
FIG. 1 is a configuration diagram showing an insulation deterioration diagnostic apparatus according to Embodiment 1 of the present invention.

FIG. 1 is a configuration diagram showing an insulation deterioration diagnostic apparatus 101 according to Embodiment 1 of the present invention. A plurality of electric paths 6a, 6b, and 6c are connected between an inverter device 1 and an inverter-driven load device 3. For example, in case of a three-phase driving mode three electric paths are used, or in case of a single-phase driving mode two electric paths are used. Incidentally, a ground terminal of the inverter device 1 and a ground terminal of the load device 3 may be connected to each other using a ground wire.

The inverter device 1 has a function of modulating a DC signal supplied from a preceding converter, based on a command signal from a control apparatus 2, and outputting an AC signal having an amplitude and a frequency designated by the control apparatus 2. The load device 3 is driven in accordance with the AC signal supplied from the inverter device 1 through the electric paths 6a, 6b, and 6c. The inverter-driven load device 3 may be, for example, an electric motor, an uninterruptible power supply (UPS), an electromagnetic cooker, illumination or the like.

The insulation deterioration diagnostic apparatus 101 includes a zero-phase current transformer 4, a current detector 5, a frequency calculating circuit 7, a magnetization control circuit 8, a processing circuit 90, and a display tool 11.

The zero-phase current transformer 4 is provided on the way of the electric paths 6a, 6b, and 6c, and has a function of detecting a zero-phase current flowing the feeding electric paths. The zero-phase current represents a leakage current that flows into the earth through an insulation resistance.

FIG. 2 is a perspective view showing one example of the zero-phase current transformer 4. The zero-phase current transformer 4 can detect a zero-phase current obtained by summing the currents of three phases (Ia+Ib+Ic) flowing through the load device 3. The transformer 4 includes an annular magnetic core 15, a magnetizing coil 16 wound around the magnetic core 15, a detecting coil 17 wound around the magnetic core 15. The three electric paths 6a, 6b, and 6c to be detected are arranged so as to penetrate through the magnetic core 15.

Incidentally, for easier understanding, FIG. 2 illustrates that the magnetizing coil 16 and the detecting coil 17 are each locally wound at each side. However, in order to suppress output fluctuation due to uneven winding of the coil or due to the external magnetic field, in general, both the magnetizing coil 16 and the detecting coil 17 are wound evenly over the entire circumference of the magnetic core 15. Further, though the coils are wound directly on the magnetic core 15, for the purpose of preventing deterioration of the characteristic of the magnetic core 15 due to winding stress, the coils may be wound on an outer surface of, e.g., a resin-made case enclosing the magnetic core 15 therein.

Returning to FIG. 1, the current detector 5 has a function of detecting a waveform of a current supplied to the load device 3. For example, the current detector 5 may be structured of a shunt resistor or a current transformer employing a Hall element or a magnetoresistive element (MR element). In place of the current detector 5, a voltage detector that detects a waveform of a voltage supplied to the load device 3 may be employed.

The frequency calculating circuit 7, which may be structured of, e.g., a frequency counter, has a function of calculating a drive frequency fd of the load device 3 based on the current waveform measured by the current detector 5.

The magnetization control circuit 8 has a function of supplying an alternating current having a frequency fe that is at least twice as high as the drive frequency fd of the load device 3 (fe≥2×fd) to the magnetizing coil 16 of the zero-phase current transformer 4, to magnetize the magnetic core 15. For example, the magnetization control circuit 8 may be structured of a combination of a variable frequency oscillator and a power amplifier.

The processing circuit 90 carries out the output signal processing of the zero-phase current transformer 4 and the insulation deterioration diagnosis. In this embodiment, the processing circuit 90 is structured of a synchronization detecting circuit 9 and an insulation deterioration diagnostic circuit 10. The synchronization detecting circuit 9 uses the drive frequency fd calculated by the frequency calculating circuit 7 to extract a frequency component that is identical to the drive frequency fd from the output signal of the detecting coil 17 of the zero-phase current transformer 4. The insulation deterioration diagnostic circuit 10 is structured of, e.g., a microprocessor, to carry out the insulation deterioration diagnosis based on the output signal from the synchronization detecting circuit 9.

The display tool 11, which may be structured of, e.g., a display, indicates the result of the insulation deterioration diagnosis. In place of the display tool 11, a security device, such as a ground fault interrupter, an earth leakage relay, or an alert buzzer, may be used, or any means suitable for the operation of the load device 3 after the insulation deterioration diagnosis may be appropriately selected.

Next, the insulation deterioration diagnostic method will be described below. First, the case where the magnetization control circuit 8 is not in operation is described. The zero-phase current transformer 4 collects the zero-phase magnetic field generated from the zero-phase current which is the sum of the single-phase to and fro currents or two-phase or three-phase currents respectively flowing through the electric paths 6a, 6b, and 6c, to the magnetic core 15, and a current flows through a load resistor (not shown) connected between the terminals of the detecting coil 17 so as to cancel out the collected magnetic flux. Provided that the coupling coefficient is 1, the current having a value obtained by dividing the zero-phase current by the number of turns of the detecting coil 17 flows through the detecting coil 17. Accordingly, since the current in accordance with the turn ratio can be detected, it is called "current transformer".

FIGS. 3A to 3C are each an explanatory diagram showing a state where the zero-phase current occurs. As shown in FIG. 3A, for example, it is assumed that three-phase alternating currents having a frequency of 60 Hz (solid line: U-phase, dotted line: V-phase, gray line: W-phase) are flowing through the electric paths 6a, 6b, and 6c, respectively. On the other hand, as shown in FIG. 3B, in another case where the leakage current occurs only at one phase (e.g., V-phase), resulting in different wave height values, the zero-phase current exhibits a current of 60 Hz, as shown in FIG. 3C. That is, the frequency of the zero-phase magnetic field applied to the magnetic core 15 of the zero-phase current transformer 4 is 60 Hz.

The load device 3 is driven with desired current value and frequency in accordance with an inverter driving scheme. Since the frequency of the current supplied to the load device 3 can vary depending on the driving condition of the load device 3, the frequency of the zero-phase current can also vary correspondingly within a range of, for example, some Hz being nearly DC to several hundreds Hz. At this time, the magnetic element of the zero-phase current transformer 4 generally has a frequency characteristic that the magnetic characteristic differs corresponding to the frequency of the applied magnetic field. PC permalloy that is employed for sensitively collecting the minute electric current, such as zero-phase current, is also one of the magnetic materials whose characteristic changes in accordance with the frequency.

FIGS. 4A and 4B are each an explanatory diagram schematically showing the frequency characteristic of PC permalloy. FIG. 4A shows frequency variation of B-H curve and FIG. 4B shows frequency variation of relative permeability. It can be seen that a gradient of the B-H curve (corresponding to the permeability×relative permeability in the air) varies depending on the frequency of the applied magnetic field, and the relative permeability at 15 Hz is larger than that at 60 Hz, hence the former detection sensitivity is higher than the latter. Please note that the saturation magnetic flux density is constant irrespective of the frequency.

Accordingly, in case where the zero-phase magnetic fields having an identical effective value and different frequencies are applied, the lower the frequency is, the higher the detection sensitivity becomes. In this case, however, the magnetic core tends to enter the magnetically saturated state. As a result, the measurement precision of the zero-phase current is impaired with a narrowed measurement range.

Next, the case where the magnetization control circuit 8 is in operation is described. The drive frequency fd of the load device 3 can be acquired by the frequency calculating circuit 7. The magnetization control circuit 8 selects, with respect to the drive frequency fd of the load device 3, the magnetizing frequency fe suitable for a sampling rate (at least twice as high as the drive frequency fd) given by a user, to output the magnetizing current. This magnetizing current flows through the magnetizing coil 16 of the zero-phase current transformer 4 to generate the magnetizing field, which is collected into the magnetic core 15. Incidentally, it is preferable that the operation range of the magnetizing field is set solely in the linear region of BH characteristic of the magnetic core 15, and magnetic saturation does not occur even in a case where the magnetic field (zero-phase magnetic field) of the zero-phase current is superimposed.

When the effective value and the frequency of the magnetizing field are greater than those of the zero-phase magnetic field, the magnetizing field is dominant in the magnetic field collected into the magnetic core 15, resulting in a state that the zero-phase magnetic field is superimposed on that magnetizing field. That is, both components of a frequency to be measured and the magnetizing frequency are mixed in the output signal of the zero-phase current transformer 4.

The synchronization detecting circuit 9 extracts a frequency component identical to the drive frequency fd from the output signal of the zero-phase current transformer 4. Utilization of synchronous detection allows the signal component of solely the frequency to be measured contained in the output signal of the zero-phase current transformer 4 to be extracted with a higher S/N ratio.

Here, even when the identical zero-phase current value is detected, as long as the magnetizing frequency differs, the signal component value extracted by the synchronous detection varies depending on the frequency characteristic of the magnetic core 15. To cope with this matter, a function of correcting the detected zero-phase current based on the frequency characteristic of the zero-phase current transformer 4 can be installed in the insulation deterioration diagnostic circuit 10 to reduce the dependency of the drive frequency. As a result, the insulation deterioration diagnostic circuit 10 can carry out a precise insulation deterioration diagnosis.

The display tool 11 can present to a user, for example, temporal transition of the insulation resistance value and the leakage current value, lifetime and failure alert of the load device 3, which can be obtained by processing based on the insulation resistance value and the leakage current value calculated by the processing circuit 90. Further, in order to calculate the insulation resistance value, the values of the phase voltage applied to the load device are required. Here, it is also possible to obtain the relationship of the phase voltage applied to the load device by calculation. For example, in case of the load device 3 being an electric motor, it can be calculated from the drive speed or the number of poles of the electric motor, and the insulation resistance value can be calculated according to the Ohm's law from the zero-phase current and the phase voltage.

Here, the processing circuit 90 uses by way of example the synchronization detecting circuit as a circuit that can extract a frequency component identical to the drive frequency fd. Alternatively, it is possible to use a band-pass filter that can extract a signal component close to the drive frequency fd.

Thus, according to this embodiment, even when the drive frequency fd is low, the magnetic saturation of the magnetic core 15 can be prevented by magnetizing the magnetic core 15 at the frequency fe higher than the drive frequency fd (preferably, fe ≥2×fd). Further, the dependency of the drive frequency can be reduced by correcting the detected zero-phase current based on the frequency characteristic of the zero-phase current transformer 4. As a result, a reliable insulation deterioration diagnosis can be carried out.

(Embodiment 2)

Figure 5:
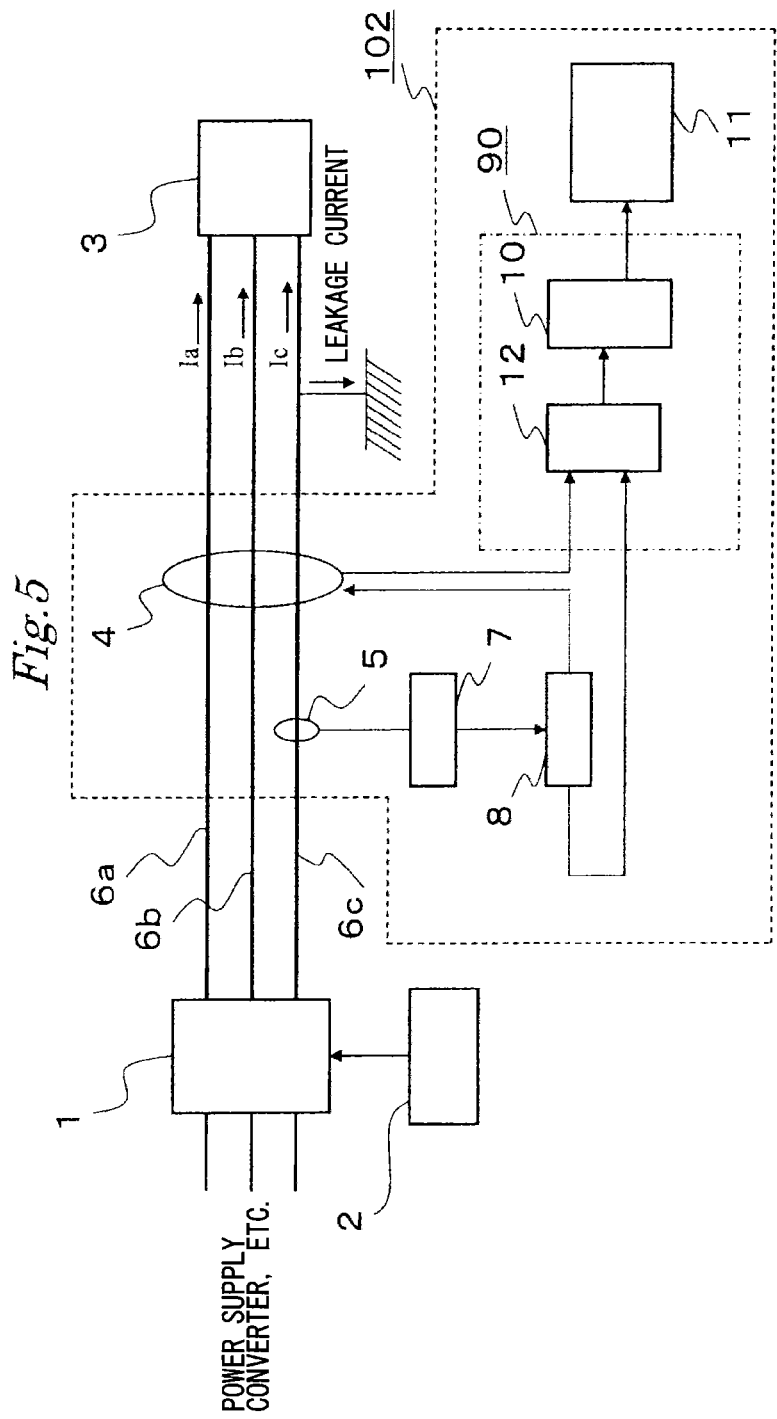
FIG. 5 is a configuration diagram showing an insulation deterioration diagnostic apparatus according to Embodiment 2 of the present invention.

FIG. 5 is a configuration diagram showing an insulation deterioration diagnostic apparatus 102 according to Embodiment 2 of the present invention. The insulation deterioration diagnostic apparatus 102 according to this embodiment is structured similarly to the insulation deterioration diagnostic apparatus 101 according to Embodiment 1 except that it employs, in place of the synchronization detecting circuit 9, a second harmonic detecting circuit 12 for extracting a second harmonic component (2×fe) of the magnetizing frequency fe of the magnetic core 15 from the output signal of the zero-phase current transformer 4.

Figure 6:
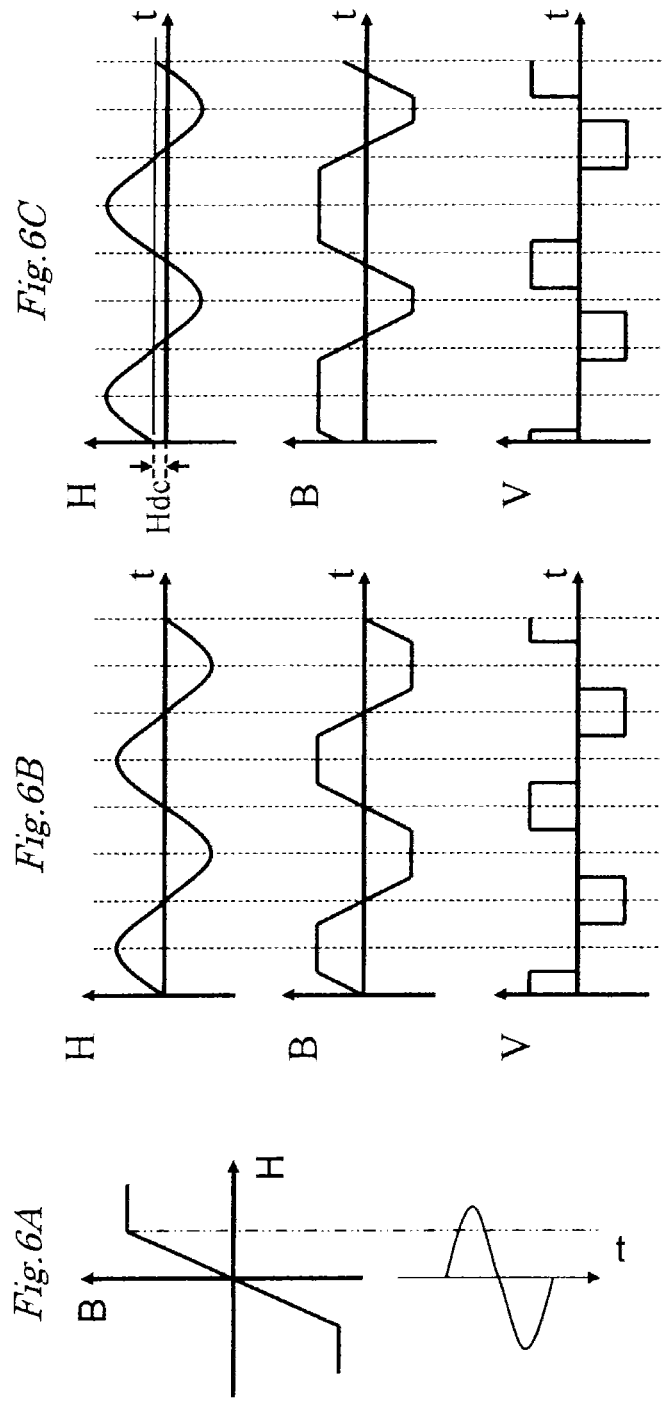
FIGS. 6A to 6C are each an explanatory diagram of the operation principle of the present embodiment.

FIGS. 6A to 6C are each an explanatory diagram of the operation principle according to this embodiment. FIG. 6A shows B-H curve of the magnetic core 15 and the waveform of the magnetizing field. FIG. 6B shows a state where the magnetic core 15 is magnetically saturated. FIG. 6C shows a state where a DC magnetic field is superimposed.

As shown in FIG. 6A, when the sinusoidal magnetizing field H is applied to the magnetic core 15 and part of the waveform reaches the magnetism saturation level, then, as shown in FIG. 6B, variation of the magnetic flux density B in the magnetic element is zero during magnetic saturation, and the detection voltage V in the detecting coil 17 is also zero according to the law of electromagnetic induction.

In this state, as shown in FIG. 6C, when a certain DC magnetic field Hdc is superimposed on the sinusoidal magnetizing field, the saturation period on the plus side becomes longer, and the saturation period on the minus side becomes shorter. Accordingly, as for the detection voltage V detected by the detecting coil 17, the time interval showing zero is varied with a double cycle.

Since the effective value of the second harmonic signal component of the detection voltage is substantially proportional to the DC magnetic field superimposed on the magnetic core 15, the effective value of the DC magnetic field can be calculated. Even in a case where the magnetic field being superimposed is not a DC magnetic field but an AC magnetic field, setting the magnetizing frequency to be rather larger relative to the frequency of the AC magnetic field, variation of the AC magnetic field per one wave of magnetizing field can be locally recognized as a DC magnetic field. Therefore, both the DC and AC magnetic fields can be measured.

The above Embodiment 1 is built on the premise that the operation range of the magnetizing field is set solely in the linear region of BH characteristic of the magnetic core 15 and that magnetic saturation does not occur even when the zero-phase magnetic field attributed to the zero-phase current is superimposed. However, in this embodiment, the operation range of the magnetizing field is set in a region including the saturation region of BH characteristic of the magnetic core 15.

The magnetization control circuit 8 selects, with respect to the drive frequency fd of the load device 3, the magnetizing frequency fe suitable for a sampling rate (at least twice as high as the drive frequency fd) given by a user, to energize the magnetizing coil 16 of the zero-phase current transformer 4 with an optimum magnetizing current (i.e., the magnetizing current which can magnetically saturate the magnetic core) at that magnetizing frequency fe.

The second harmonic detecting circuit 12 extracts a frequency component (2×fe) which is twice as high as the magnetizing frequency fe from the output signal of the zero-phase current transformer 4, to extract a varied amount due to the zero-phase current. Here, even when the identical zero-phase current value is detected, as long as the magnetizing frequency differs, the extracted signal component value varies depending on the frequency characteristic of the magnetic core 15. To cope with this matter, a function of correcting the detected zero-phase current based on the frequency characteristic of the zero-phase current transformer 4 can be installed in the insulation deterioration diagnostic circuit 10 to reduce the dependency of the drive frequency. As a result, the insulation deterioration diagnostic circuit 10 can carry out a precise insulation deterioration diagnosis.

Here, the processing circuit 90 uses by way of example the second harmonic detecting circuit as a circuit that can extract a second harmonic component of the magnetizing frequency fe. Alternatively, it is possible to use a band-pass filter that can extract a signal component close to the frequency component (2×fe).

Thus, according to this embodiment, extracting the variation during magnetism saturation as the variation of the frequency component (2×fe) which is twice as high as the magnetizing frequency fe, the zero-phase current can be detected at high precision. Further, the dependency of the drive frequency can be reduced by correcting the detected zero-phase current based on the frequency characteristic of the zero-phase current transformer 4. As a result, a reliable insulation deterioration diagnosis can be carried out.

(Embodiment 3)

Figure 7:
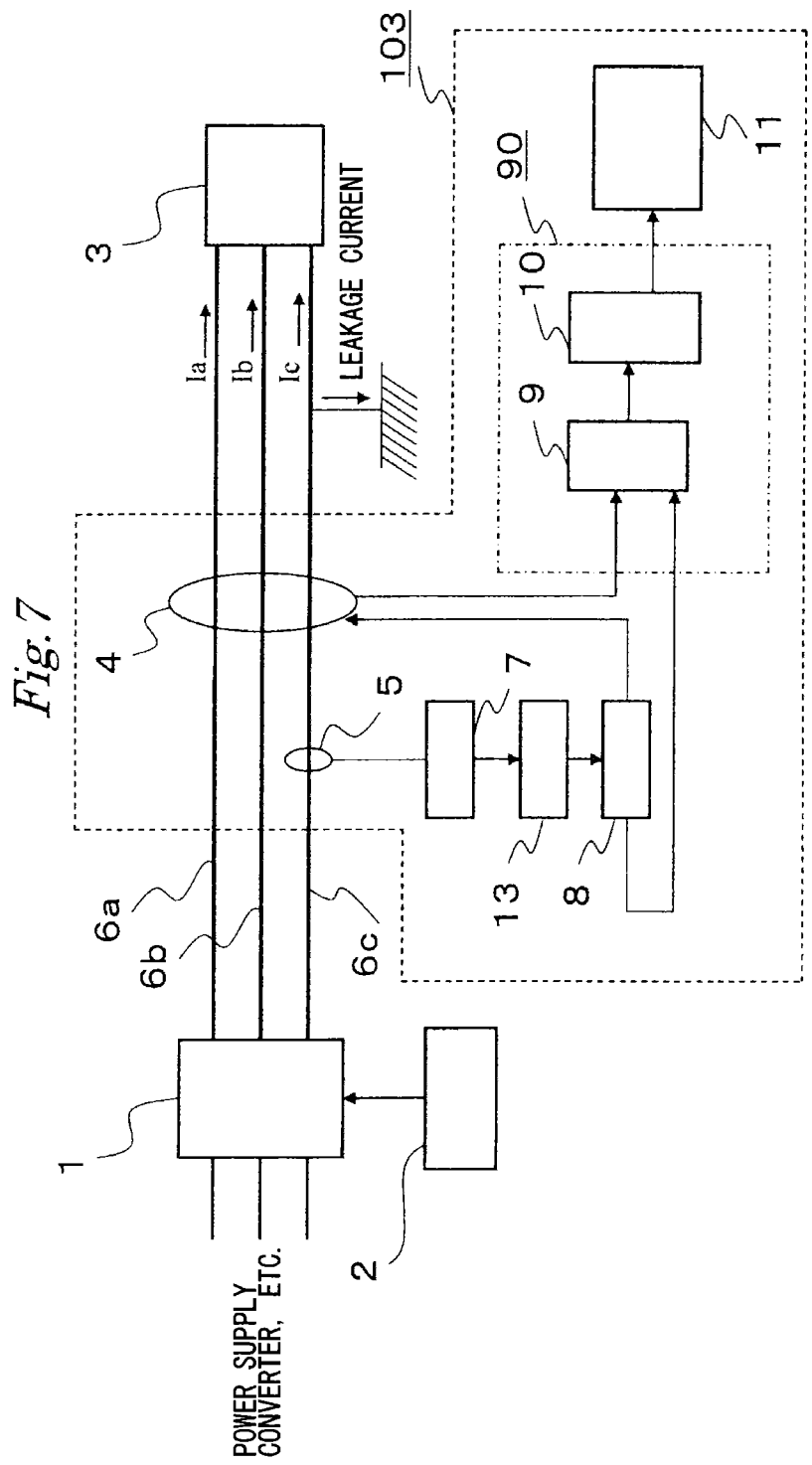
FIG. 7 is a configuration diagram showing an insulation deterioration diagnostic apparatus according to Embodiment 3 embodiment of the present invention.

FIG. 7 is a configuration diagram showing an insulation deterioration diagnostic apparatus 103 according to Embodiment 3 of the present invention. The insulation deterioration diagnostic apparatus 103 according to this embodiment is structured similarly to the insulation deterioration diagnostic apparatus 101 according to Embodiment 1 except that it additionally includes an operation determination circuit 13 between the frequency calculating circuit 7 and the magnetization control circuit 8.

The operation determination circuit 13, which can be structured of, e.g., a microprocessor, performs a threshold determination based on the calculation result of the frequency calculating circuit 7, to determine whether or not a magnetizing operation is to be carried out by the magnetization control circuit 8 based on the determination result.

Though it is desirable that the insulation deterioration diagnosis is constantly carried out, periodic diagnosis may be sufficient depending on an operating condition of the load device. Further, the magnetizing operation of the magnetic core 15 may increase the power consumption.

To cope with this matter, it is also possible to control the magnetizing operation of the magnetic core 15 in accordance with the drive frequency fd of the load device 3. That is, the magnetization control circuit 8 is operated with the zero-phase current of a low frequency band, while the magnetization control circuit 8 is not operated with the zero-phase current of a commercial frequency or a high frequency band and the magnetic core 15 is operated as a generally known zero-phase current transformer 4, thereby suppressing power consumption. The threshold frequency for determining whether or not the operation is to be carried out may be arbitrarily set by a user taking into consideration of the lower limit value, the upper limit value and the like of the drive frequency fd of the load device 3.

Here, this embodiment describes by way of example the operation determination circuit 13 added to the structure of Embodiment 1. However, it is also possible to add the operation determination circuit 13 between the frequency calculating circuit 7 and the magnetization control circuit 8 in Embodiment 2. In this case, since the zero-phase current transformer 4 of the flux gate scheme can magnetize the magnetic core 15 up to the saturation region of BH characteristic thereof, suppression of power consumption is more effective as compared to the case where the circuit is applied to Embodiment 1.

(Embodiment 4)

Figure 8:
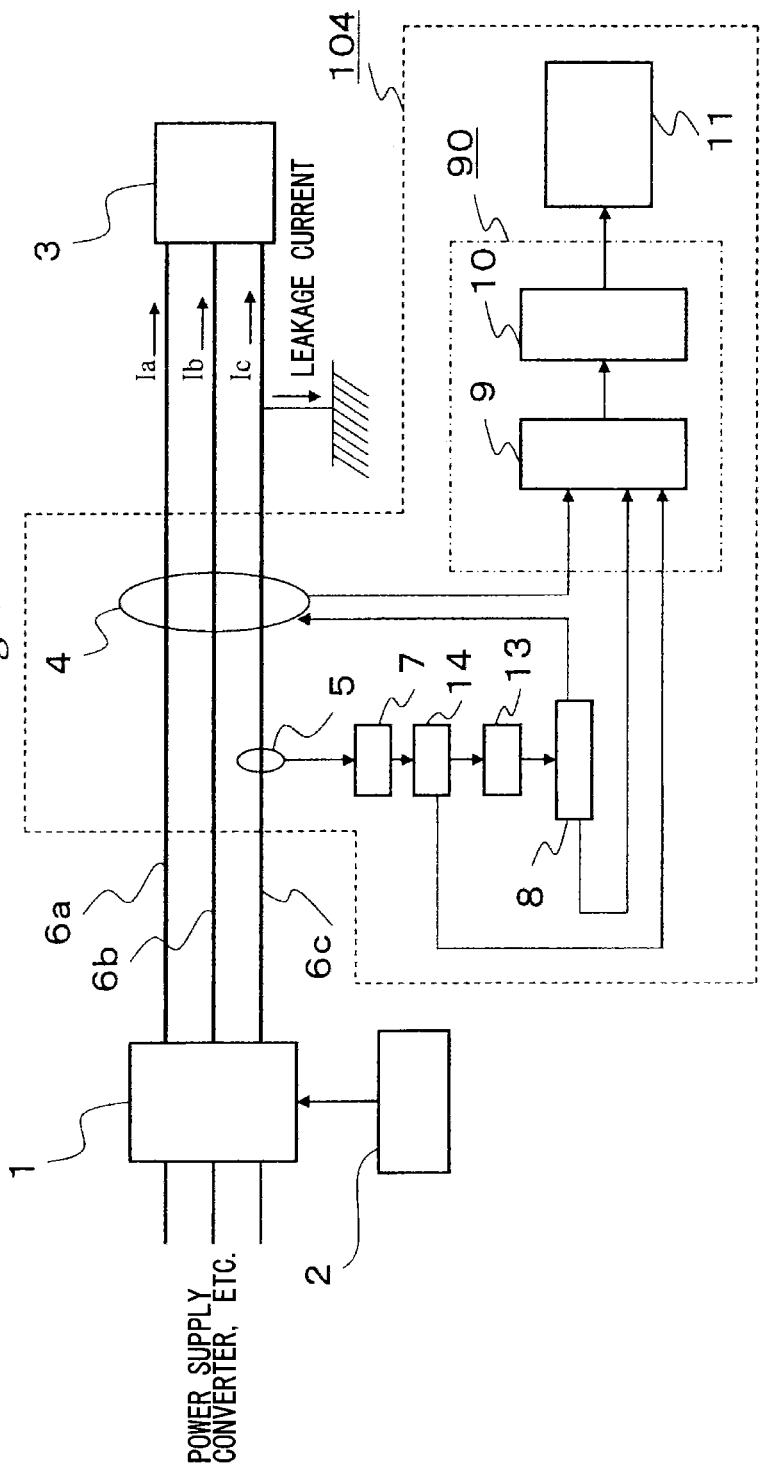
FIG. 8 is a configuration diagram showing an insulation deterioration diagnostic apparatus according to Embodiment 4 of the present invention.

FIG. 8 is a configuration diagram showing an insulation deterioration diagnostic apparatus 104 according to Embodiment 4. The insulation deterioration diagnostic apparatus 104 according to this embodiment is structured similarly to the insulation deterioration diagnostic apparatus 103 according to Embodiment 3 except that it additionally includes a diagnosis determination circuit 14 between the frequency calculating circuit 7 and the operation determination circuit 13.

The diagnosis determining circuit 14, which can be structured of, e.g., a microprocessor, determines whether or not the insulation deterioration diagnosis is to be carried out by the processing circuit 90, based on the calculation result of the frequency calculating circuit 7.

In each structure of Embodiments 1 to 3, for the frequency of the magnetizing current supplied from the magnetization control circuit 8, the magnetizing frequency fe suitable for a sampling rate (at least twice as high as the drive frequency fd) given by a user, is selected with respect to the drive frequency fd of the load device 3. However, depending on usage environment or application of the load device 3, the drive frequency fd of the load device 3 does not change dramatically taking into consideration of the concept of inverter driving, as long as it is used for fixed operations or monotonous operations. Further, it is more important to carry out the insulation deterioration diagnosis in a periodic and precise manner, rather than in a quick response.

In other words, in order to precisely diagnose the insulation deterioration, it is desirable that the diagnosis is carried out in a state where the drive frequency fd of the load device 3 is stable. To this end, it is preferable to provide, at the front stage of the magnetization control circuit 8 and the operation determination circuit 13, the diagnosis determination circuit 14 that determines variation of the drive frequency fd of the load device 3 to issue a command of carrying out the insulation deterioration diagnosis to the operation determination circuit 13 and the detection circuit 90 at the rear-stage.

Further, in order to diagnose the insulation deterioration, it is also possible to provide in the control apparatus 2 an insulation deterioration diagnosis mode for driving the load device 3 at a constant frequency. In particular, in case where the inverter-driven load device 3 is an electric motor, unless there are no particular restrictions on the load environment or the drive environment of the electric motor, the drive speed of the electric motor is set to be high. In general the drive speed of the electric motor can be controlled by controlling the drive voltage frequency, in which the drive speed is proportional to the drive voltage frequency. Further, as for control scheme, a V/f constant control is frequently employed so that a ratio between the drive voltage applied to each phase of the electric motor and the drive voltage frequency is controlled to be constant. Accordingly, the higher the drive voltage frequency is, the higher the drive voltage applied to each phase of the electric motor is. Naturally, a larger current can leak through the insulation resistance, thereby facilitating the insulation deterioration diagnosis. However, in some cases where the stroke of free shift is short, such as stage shifting of a carrier machine or a lathe of a processing machine, the drive speed cannot be increased, and therefore the drive speed of the electric motor is often set to be low. In such cases, the techniques described in Embodiments 1 to 3 are effective.

(Embodiment 5)

Figure 9:
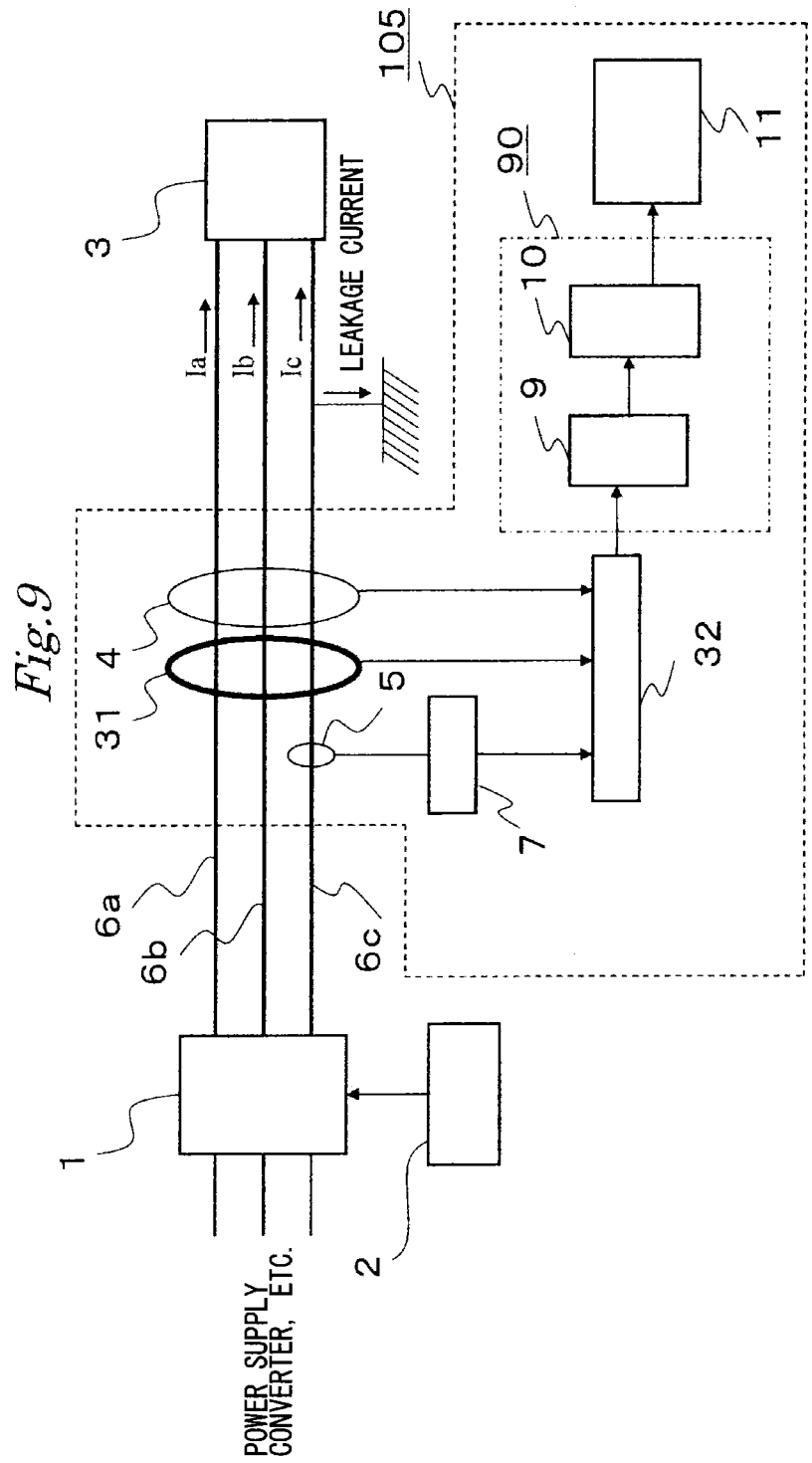
FIG. 9 is a configuration diagram showing an insulation deterioration diagnostic apparatus according to Embodiment 5 of the present invention.

FIG. 9 is a configuration diagram showing an insulation deterioration diagnostic apparatus 105 according to Embodiment 5 of the present invention. The plurality of electric paths 6a, 6b, and 6c are connected between the inverter device 1 and the inverter-driven load device 3. For example, in case of a three-phase driving mode three electric paths are used, or in case of a single-phase driving mode two electric paths are used. Incidentally, the ground terminal of the inverter device 1 and the ground terminal of the load device 3 may be connected to each other using a ground wire.

The inverter device 1 has a function of modulating a DC signal supplied from a preceding converter, based on a command signal from a control apparatus 2, and outputting an AC signal having an amplitude and a frequency designated by the control apparatus 2. The load device 3 is driven in accordance with the AC signal supplied from the inverter device 1 through the electric paths 6a, 6b, and 6c. The inverter-driven load device 3 may be, for example, an electric motor, an uninterruptible power supply (UPS), an electromagnetic cooker, illumination or the like.

The insulation deterioration diagnostic apparatus 105 includes a plurality of (two herein) zero-phase current transformers 4 and 31, a current detector 5, a frequency calculating circuit 7, a conversion determination circuit 32, a processing circuit 90, and a display tool 11.

The zero-phase current transformers 4 and 31 are provided on the way of the electric paths 6a, 6b, and 6c, and each has a function of detecting a zero-phase current flowing the feeding electric paths. The zero-phase current represents a leakage current that flows into the earth through an insulation resistance. The zero-phase current transformers 4 and 31 can each detect a zero-phase current obtained by summing the currents of three phases (Ia+Ib+Ic) flowing through the load device 3. Each of the transformers 4 and 31 includes an annular magnetic core, and a detecting coil wound around the magnetic core. The three electric paths 6a, 6b, and 6c to be detected are arranged so as to penetrate through the magnetic core.

The current detector 5 has a function of detecting a waveform of a current supplied to the load device 3. For example, the current detector 5 may be structured of a shunt resistor or a current transformer employing a Hall element or a magnetoresistive element (MR element). In place of the current detector 5, the voltage detector that detects a waveform of a voltage supplied to the load device 3 may be employed.

The frequency calculating circuit 7, which may be structured of, e.g., a frequency counter, has a function of calculating a drive frequency fd of the load device 3 based on the current waveform measured by the current detector 5.

The conversion determination circuit 32, which may be structured of, e.g., a microprocessor, determines which of the plurality of zero-phase current transformers 4 and 31 is used to carry out the insulation deterioration diagnosis using an output signal therefrom, based on the calculation result of the frequency calculating circuit 7.

The processing circuit 90 carries out the output signal processing of the zero-phase current transformer 4 and the insulation deterioration diagnosis. In this embodiment, the processing circuit 90 is structured of a synchronization detecting circuit 9 and an insulation deterioration diagnostic circuit 10. The synchronization detecting circuit 9 uses the drive frequency fd calculated by the frequency calculating circuit 7 to extract the frequency component that is identical to the drive frequency fd from the output signal of the detecting coil 17 of the zero-phase current transformer 4. The insulation deterioration diagnostic circuit 10 is structured of, e.g., a microprocessor, to carry out the insulation deterioration diagnosis based on the output signal from the synchronization detecting circuit 9.

The display tool 11, which may be structured of, e.g., a display, indicates the result of the insulation deterioration diagnosis. In place of the display tool 11, a security device, such as a ground fault interrupter, an earth leakage relay, or an alert buzzer, may be used, or any means suitable for the operation of the load device 3 after the insulation deterioration diagnosis may be appropriately selected.

In this embodiment, at least one zero-phase current transformer 31 is provided in addition to the zero-phase current transformer 4. The zero-phase current transformers 4 and 31 have magnetism saturation levels different from each other.

For example, the magnetic core of the zero-phase current transformer 31 has a volume larger than that of the zero-phase current transformer 4.

In case where measuring a low frequency of zero-phase current, the lower the frequency of the zero-phase magnetic field is, the more the magnetic core of the zero-phase current transformer is prone to be magnetically saturated. When the magnetic saturation occurs, the current waveform flowing through the detecting coil cannot reproduce the waveform of the zero-phase current, thereby lowering the measurement precision of the zero-phase current transformer 4. In order to prevent this matter, such a zero-phase current transformer that is not magnetically saturated under the low frequency of zero-phase current is preferably used. Accordingly, additional install of the zero-phase current transformer 31 having a larger volume of the magnetic core than that of the zero-phase current transformer 4 can precisely measure the low frequency of zero-phase current.

However, increasing the volume of the magnetic core may result in an increased number of turns of the coil, hence an increased resistance of the coil and an increased cross sectional area of the magnetic core. Consequently, the measurement precision may be lowered depending on the frequency of the zero-phase current to be measured. Accordingly, in this embodiment, only in a case of measuring a low frequency of zero-phase current, the zero-phase current transformer 31 having an increased volume of magnetic core is added and the conversion determination circuit 32 determines which of the zero-phase current transformers 4 and 31 is used to carry out the insulation deterioration diagnosis using an output signal therefrom, depending on the drive frequency fd of the load device 3.

Incidentally, the threshold frequency for determining which output signal is to be used, of the zero-phase current transformer 4 or of the zero-phase current transformer 31, may be arbitrarily set by a user taking into consideration of the lower limit value and the upper limit value of the drive frequency fd of the load device 3.

This embodiment exemplifies usage of two zero-phase current transformers 4 and 31 each having a different volume of the magnetic core. However, it is also possible to use three or more zero-phase current transformers each having a different volume of the magnetic core from one another, and the threshold frequency can be set in accordance with the number of the used zero-phase current transformers.

Thus, according to this embodiment, in case where measuring a low frequency of zero-phase current, by using the zero-phase current transformer 31 with the magnetic core having a modified volume so as not to be magnetically saturated by the zero-phase magnetic field, the zero-phase current can be sensitively measured without being dependent on the drive frequency fd.

(Embodiment 6)

Figure 10:
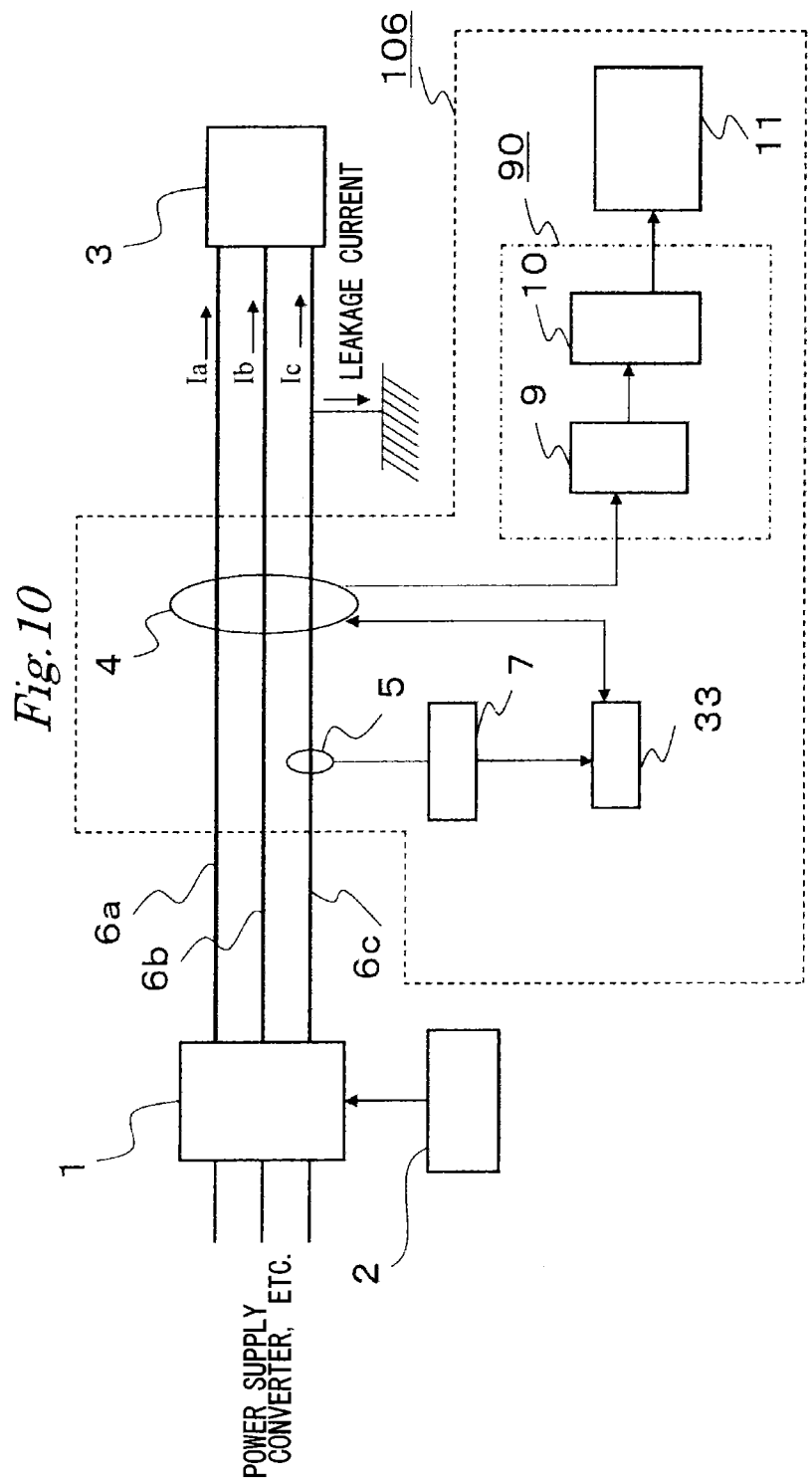
FIG. 10 is a configuration diagram showing an insulation deterioration diagnostic apparatus according to Embodiment 6 a sixth embodiment of the present invention.

FIG. 10 is a configuration diagram showing an insulation deterioration diagnostic apparatus 106 according to Embodiment 6 of the present invention. The plurality of electric paths 6a, 6b, and 6c are connected between the inverter device 1 and the inverter-driven load device 3.

For example, in case of a three-phase driving mode three electric paths are used, or in case of a single-phase driving mode two electric paths are used. Incidentally, the ground terminal of the inverter device 1 and the ground terminal of the load device 3 may be connected to each other using a ground wire.

The inverter device 1 has a function of modulating a DC signal supplied from a preceding converter, based on a command signal from a control device 2, and outputting an AC signal having an amplitude and a frequency designated by the control device 2. The load device 3 is driven in accordance with the AC signal supplied from the inverter device 1 through the electric paths 6a, 6b, and 6c. The inverter-driven load device 3 may be, for example, an electric motor, an uninterruptible power supply (UPS), an electromagnetic cooker, illumination or the like.

The insulation deterioration diagnostic apparatus 106 includes a zero-phase current transformer 4, a current detector 5, a frequency calculating circuit 7, a temperature control circuit 33, a processing circuit 90, and a display tool 11.

The zero-phase current transformer 4 is provided on the way of the electric paths 6a, 6b, and 6c, and has a function of detecting a zero-phase current flowing the feeding electric paths. The zero-phase current represents a leakage current that flows into the earth through an insulation resistance. The zero-phase current transformer 4 can detect a zero-phase current obtained by summing the currents of three phases (Ia+Ib+Ic) flowing through the load device 3. The transformer 4 includes an annular magnetic core, and a detecting coil wound around the magnetic core. The three electric paths 6a, 6b, and 6c to be detected are arranged so as to penetrate through the magnetic core.

The current detector 5 has a function of detecting a waveform of a current supplied to the load device 3. For example, the current detector 5 may be structured of a shunt resistor or a current transformer employing a Hall element or a magnetoresistive element (MR element). In place of the current detector 5, the voltage detector that detects a waveform of a voltage supplied to the load device 3 may be employed.

The frequency calculating circuit 7, which may be structured of, e.g., a frequency counter, has a function of calculating a drive frequency fd of the load device 3 based on the current waveform measured by the current detector 5.

The temperature control circuit 33 has a function of adjusting the sensitivity of the zero-phase current transformer 4 by controlling the temperature of the magnetic core included in the zero-phase current transformer 4 based on the calculation result of the frequency calculating circuit 7.

The processing circuit 90 carries out output signal processing of the zero-phase current transformer 4 and the insulation deterioration diagnosis. In this embodiment, the processing circuit 90 is structured of a synchronization detecting circuit 9 and an insulation deterioration diagnostic circuit 10. The synchronization detecting circuit 9 uses the drive frequency fd calculated by the frequency calculating circuit 7 to extract the frequency component that is identical to the drive frequency fd from the output signal of the detecting coil 17 of the zero-phase current transformer 4. The insulation deterioration diagnostic circuit 10 is structured of, e.g., a microprocessor, to carry out the insulation deterioration diagnosis based on the output signal from the synchronization detecting circuit 9.

The display tool 11, which may be structured of, e.g., a display, indicates the result of the insulation deterioration diagnosis. In place of the display tool 11, a security device, such as a ground fault interrupter, an earth leakage relay, or an alert buzzer, may be used, or any means suitable for the operation of the load device 3 after the insulation deterioration diagnosis may be appropriately selected.

In this embodiment, a heater wire is wound around the magnetic core included in the zero-phase current transformer 4, and by energizing the heater a Joule heat is generated as a heat source to heat the magnetic core. Further, a temperature sensor, such as thermocouple, may be arranged as a temperature monitor of the magnetic core.

In general, the magnetic characteristic of the magnetic element deteriorates as the temperature rises. Therefore, the permeability (gradient of B-H curve) is reduced. This embodiment exploits this deterioration of the magnetic characteristic based on this change of temperature. In case where measuring a low frequency of zero-phase current, in order to prevent the magnetic saturation for a low frequency of minute zero-phase magnetic field, the sensitivity of the zero-phase current transformer 4 can be lowered by evenly heating the magnetic core of the zero-phase current transformer 4.

However, since abrupt temperature control is not practical, it is desirable to preliminarily set the measurement time point, and to control such that a high temperature of the magnetic core of the zero-phase current transformer 4 is achieved only when the measurement is carried out.

Further, by preliminarily associating the relationship among the temperature of the magnetic core, the magnetic characteristic, and the frequency with one another, and providing the insulation deterioration diagnostic circuit 10 with a function of performing mutual calculation during measurement, the insulation deterioration diagnosis can be carried out.

Further, not only the mechanism that heats the magnetic core included in the zero-phase current transformer 4, but also a mechanism that cools the magnetic core, e.g., natural cooling means or forcible cooling means, such as a fan, may be provided. Further, control may be exerted such that the environment temperature and the temperature of the magnetic core can be correlated, in a manner of controlling the temperature of the installation environment (space) of the zero-phase current transformer 4.

Thus, according to this embodiment, in case where measuring a low frequency of zero-phase current, by adjusting the temperature of the magnetic core included in the zero-phase current transformer 4 so as to prevent the magnetic saturation caused by the zero-phase magnetic field, the sensitivity of the zero-phase current transformer 4 can be adjusted. Consequently, the zero-phase current can be sensitively measured without being dependent on the drive frequency fd.

(Embodiment 7)

Figure 11:
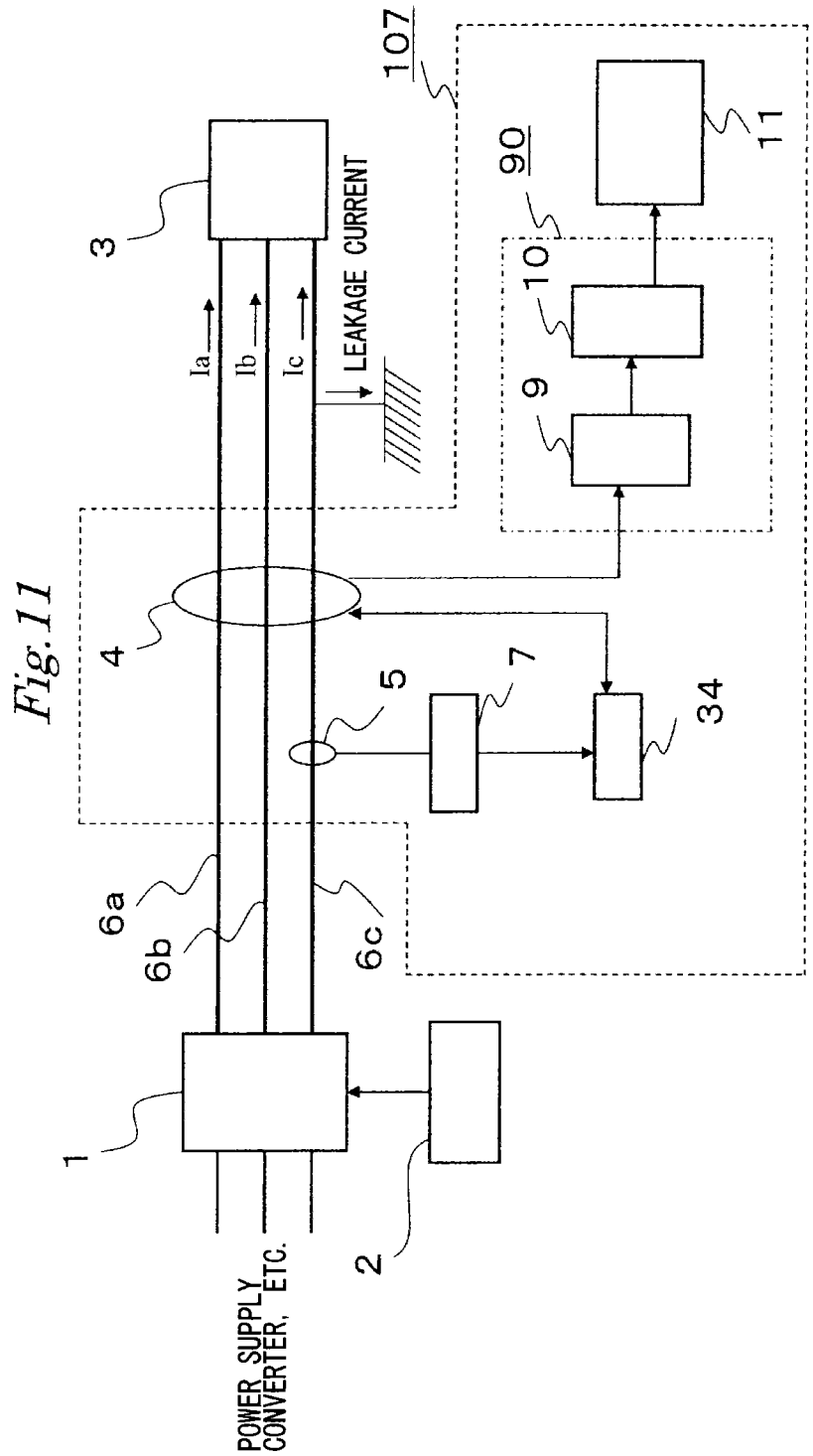
FIG. 11 is a configuration diagram showing an insulation deterioration diagnostic apparatus according to Embodiment 7 of the present invention.

FIG. 11 is a configuration diagram showing an insulation deterioration diagnostic apparatus 107 according to Embodiment 7 of the present invention. The insulation deterioration diagnostic apparatus 107 according to this embodiment is structured similarly to the insulation deterioration diagnostic apparatus 106 according to Embodiment 6, except that it includes a pressure control circuit 33 for changing a stress applied to the magnetic core of the zero-phase current transformer 4, in place of the temperature control circuit 33.

In this embodiment, for example, a piezoelectric element can be attached to the magnetic core of the zero-phase current transformer 4, so that the internal stress of the magnetic core can be controlled in accordance with an applied voltage of the piezoelectric element.

In general, the magnetic characteristic of the magnetic element varies in accordance with variations in stress, and the permeability (the gradient of B-H curve) also changes. This embodiment exploits the variation of the magnetic characteristic in accordance with variation in stress. In case where measuring a low frequency of zero-phase current, in order to prevent the magnetic saturation for a low frequency of minute zero-phase magnetic field, the sensitivity of the zero-phase current transformer 4 can be lowered by applying a stress to the magnetic core of the zero-phase current transformer 4. For such a magnetic element that can exhibit the pressure dependency, amorphous FeSiB or the like can be used.

However, since abrupt stress control is not practical, it is desirable to preliminarily set the measurement time point, and to control such that stress is applied to the magnetic core of the zero-phase current transformer 4 only when the measurement is carried out.

Further, by preliminarily associating the relationship among the internal stress of the magnetic core, the magnetic characteristic, and the frequency with one another, and providing the insulation deterioration diagnostic circuit 10 with a function of performing mutual calculation during measurement, the insulation deterioration diagnosis can be carried out.

Incidentally, this embodiment is not applicable to the magnetic material that does not exhibit a reversible characteristic in response to the presence or absence of stress. For example, the magnetic characteristic of the amorphous FeSiB or the like exhibits the reversible characteristic in response to the stress attributed to an external strain.

Thus, according to this embodiment, in case where measuring a low frequency of zero-phase current, by adjusting the internal stress of the magnetic core included in the zero-phase current transformer 4 so as to prevent the magnetic saturation caused by the zero-phase magnetic field, the sensitivity of the zero-phase current transformer 4 can be adjusted. Consequently, the zero-phase current can be sensitively measured without being dependent on the drive frequency fd.

EXPLANATORY NOTE

1: inverter device, 2: control device, 3: load device,
4, 31: zero-phase current transformer, 5: current detector,
6a, 6b, 6c: electric path, 7: frequency calculating circuit,
8: magnetization control circuit,
9: synchronization detecting circuit,
10: insulation deterioration diagnostic circuit,
11: display tool, 12: second harmonic detecting circuit,
13: operation determination circuit,
14: diagnosis determination circuit,
15: magnetic core, 16: magnetizing coil, 17: detecting coil,
32: conversion determination circuit,
33: temperature control circuit, 34: stress control circuit,
90: processing circuit,
101 to 107: insulation deterioration diagnostic apparatus.

The invention claimed is:

1. An insulation deterioration diagnostic apparatus for an electric path connected between an inverter device and an inverter-driven load device, comprising:
    a zero-phase current transformer having an annular magnetic core, a magnetizing coil wound around the magnetic core, and a detecting coil wound around the magnetic core, the transformer being for detecting a zero-phase current of an electric path;
    a magnetization control circuit for supplying an alternating current having a frequency at least twice as high as a drive frequency of the load device to the magnetizing coil to magnetize the magnetic core; and
    a frequency extracting circuit for extracting a predetermined frequency component from an output signal of the detecting coil;
    a detector for detecting one of a current waveform or a voltage waveform supplied to the load device,
    wherein the magnetization control circuit controls the current supplied to the magnetizing coil based on an output signal of the detector.

2. The insulation deterioration diagnostic apparatus according to claim 1, further comprising:

a frequency calculating circuit for calculating the drive frequency based on the output signal of the detector, wherein the frequency extracting circuit extracts a frequency component identical to the drive frequency, from the output signal of the detecting coil.

3. The insulation deterioration diagnostic apparatus according to claim 1, wherein the frequency extracting circuit extracts a second harmonic component of the magnetizing frequency of the magnetic core.

4. The insulation deterioration diagnostic apparatus according to claim 1, further comprising:

a frequency calculating circuit for calculating the drive frequency based on the output signal of the detector; and an operation determination circuit for determining whether or not the magnetization control circuit is to be operated, based on a calculation result of the frequency calculating circuit.

5. The insulation deterioration diagnostic apparatus according to claim 1, further comprising:

a frequency calculating circuit for calculating the drive frequency based on the output signal of the detector; and a diagnosis determination circuit for determining whether or not the insulation deterioration diagnosis is to be carried out, based on the calculation result of the frequency calculating circuit.

\* \* \* \* \*